(12) United States Patent
Kim et al.

(10) Patent No.: US 7,944,758 B2
(45) Date of Patent: May 17, 2011

(54) NON-VOLATILE MEMORY DEVICE AND METHOD FOR COPY-BACK THEREOF

(75) Inventors: Nam-Kyeong Kim, Gyeonggi-do (KR); Jung-Min Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 25 days.

(21) Appl. No.: 12/492,446

(22) Filed: Jun. 26, 2009

(65) Prior Publication Data

US 2010/0182845 A1    Jul. 22, 2010

(30) Foreign Application Priority Data

Jan. 19, 2009    (KR) .................. 10-2009-0004264

(51) Int. Cl.
 *G11C 16/04* (2006.01)
(52) U.S. Cl. ......... 365/185.28; 365/185.11; 365/185.12; 365/185.19; 365/185.24; 711/143
(58) Field of Classification Search ............. 365/185.11, 365/185.12, 185.19, 185.24, 185.28; 711/143
See application file for complete search history.

(56) References Cited

U.S. PATENT DOCUMENTS

| | | | | |
|---|---|---|---|---|
| 6,614,689 B2 * | 9/2003 | Roohparvar | ............. | 365/185.22 |
| 7,313,028 B2 * | 12/2007 | Ju | ............. | 365/185.25 |
| 2006/0279989 A1 * | 12/2006 | Seong et al. | ............. | 365/185.03 |
| 2008/0082730 A1 * | 4/2008 | Kim et al. | ............. | 711/103 |
| 2008/0263262 A1 * | 10/2008 | Sokolov et al. | ............. | 711/100 |

FOREIGN PATENT DOCUMENTS

KR    1020070002344    1/2007

OTHER PUBLICATIONS

Notice of Allowance issued from Korean Intellectual Property Office on Aug. 13, 2010.

* cited by examiner

*Primary Examiner* — Hoai V Ho
(74) *Attorney, Agent, or Firm* — IP & T Group LLP

(57) ABSTRACT

A method for performing a copy-back operation in a non-volatile memory device includes: measuring and recording a maximum program voltage used to program a part of target data to copy-back when a copy-back command is inputted; and performing a copy-back operation using the recorded maximum program voltage.

14 Claims, 5 Drawing Sheets

NON-VOLATILE MEMORY DEVICE AND METHOD FOR COPY-BACK THEREOF

CROSS-REFERENCE TO RELATED APPLICATIONS

The present invention claims priority of Korean patent application number 10-2009-0004264, filed on Jan. 19, 2009, the disclosure of which is incorporated herein by reference in its entirety.

BACKGROUND OF THE INVENTION

The present invention relates to a memory device and a programming method thereof, and more particularly, to a non-volatile memory device and a method for performing a copy-back operation thereof.

A memory device is classified into a volatile memory device and a non-volatile memory device according to capability of maintaining stored data without power supplied. The volatile memory device cannot sustain stored data when power is interrupted and typical volatile memory devices are a dynamic random access memory (DRAM) and a synchronous random access memory (SRAM). The non-volatile memory device maintains stored data although power is interrupted and a typical non-volatile memory device is a flash memory.

FIG. 1 is a diagram illustrating a basic structure of a non-volatile memory device according to the related art. In FIG. 1, DSL denotes a drain selection line and SSL indicates a source selection line.

As shown, a cell array of a non-volatile memory device, particularly, a NAND flash memory device, includes a plurality of memory cells MC for storing data, a plurality of word lines WL for selecting and activating memory cells MC, and a plurality of bit lines BL for inputting data to the memory cells MC and outputting data stored in the memory cells MC. The plurality of word lines WL and bit lines BL are arranged in matrix. Here, the plurality of memory cells MC are connected between a source selection transistor SST and a drain selection transistor DST in series. That is, the plurality of memory cells MC form a string structure.

A gate electrode of each memory cell MC is connected to a corresponding word line WL. A set of memory cells MC commonly connected to the same word line WL is referred as a page PG. The page PG may be divided into an even page connected to even bit lines BLe and an odd page connected to odd bit lines BLo. An even bit line BLe and an odd bit line BLo may be connected to one page buffer PB. A plurality of strings connected to each bit line BL are connected to a common source line CSL in parallel, thereby forming a memory block MB.

The NAND flash memory device having the above described structure performs a program operation and a read operation by a unit of a page PG and performs an erase operation by a unit of a memory block MB. The NAND flash memory device also supports a copy-back operation. Hereinafter, a copy-back operation of a NAND flash memory device will be described in detail.

The copy-back operation denotes, for example, an operation of providing data stored in a source page to a target page without externally outputting data. The copy-back operation includes a copy-back read operation for reading data stored in a source page and storing the read data in a page buffer PB and a copy-back program operation for programming the stored data in the page buffer PB into a target page. Due to such a copy-back operation, it may not be necessary for the memory device to perform an operation for outputting data to an external device and an operation for loading data on a page buffer PB from an external device. Therefore, the copy-back operation improves a speed of a memory device. For example, when a predetermined block is determined as a bad block, the copy-back operation can be used to transfer data stored in the predetermined block to a normal block.

Here, the copy-back operation may be performed based on an Incremental Step Pulse Program (ISPP) method. The ISPP method repeatedly applies a pulse type program voltage while increasing the pulse type program voltage by a predetermined level. After completely programming a memory cell, a state of the programmed memory cell transits to a program inhibit state. Thus, a memory cell MC having a fast programming speed can be programmed with a comparative low program voltage. However, a memory cell MC having a slow programming speed requires a comparative high program voltage in order to be programmed.

As described above, the ISPP method increases a program voltage by a predetermined level until a page is completely programmed. The ISPP method also sets a maximum program voltage and programs a next page when the program voltage reaches the maximum program voltage. Therefore, the ISPP method programs the next page after the program voltage reaches the maximum page voltage although a memory cell MC abnormally operates, for example, although a part of columns in a memory cell MC is repaired. Hereinafter, it will be described in detail by comparing a normal program operation and a copy-back operation.

When a memory cell MC is programmed, a latch value of a corresponding page buffer PB is changed from 'logic low level' to 'logic high level'. That is, a program voltage is repeatedly applied while increasing the program voltage by a predetermined level until the latch value changes to 'logic high level'. Since the latch value does not changes to 'logic high level' if a memory cell MC is in a repaired column, a normal program operation sets a latch value of a repaired column to 'logic high level' before programming a corresponding page.

Unlike the normal program operation, the copy-back operation does not set a page buffer of a repaired column to 'logic high level' because the copy-back operation reads data stored in a source page and programs it in a target page. That is, the copy-back operation sustains a latch value of a repaired column as 'logic low level' although a corresponding column is repaired. Therefore, when a maximum program voltage is applied, a page buffer PB ends performing the copy-back operation on a current page PG and starts performing the copy-back operation on the next page PG.

If a page includes a repaired column, a maximum program voltage is unavoidably applied to the corresponding page in the copy-back operation according to the prior art. That is, adjacent memory cells MC are interfered to each other due to an unnecessary applied high program voltage. Such interference deteriorates the memory device characteristics.

SUMMARY OF THE INVENTION

Embodiments of the present invention are directed to providing a non-volatile memory device for properly controlling a maximum program voltage used in a copy-back operation according to a state of a corresponding memory cell and a copy-back program method thereof.

In accordance with an aspect of the present invention, there is provided a method for performing a copy-back operation in a non-volatile memory device, including measuring and recording a maximum program voltage used to program when a copy-back command is inputted, and performing a copy-back operation using the recorded maximum program voltage.

In accordance with another aspect of the present invention, there is provided a method for performing a copy-back operation in a non-volatile memory device, including measuring and recording program information used to program a part of target data to copy-back when a copy-back command is inputted, and performing a copy-back operation using the recorded program information.

In accordance with still another aspect of the present invention, there is provided a non-volatile memory device including a cell array, and a driver for measuring and recording a maximum program voltage used to program a part of target data to copy-back and performing a copy-back operation using the recorded maximum program voltage when a copy-back command for data stored in the cell-array is received.

DESCRIPTION OF SPECIFIC EMBODIMENTS

Other objects and advantages of the present invention can be understood by the following description, and become apparent with reference to the embodiments of the present invention.

Figure 1:
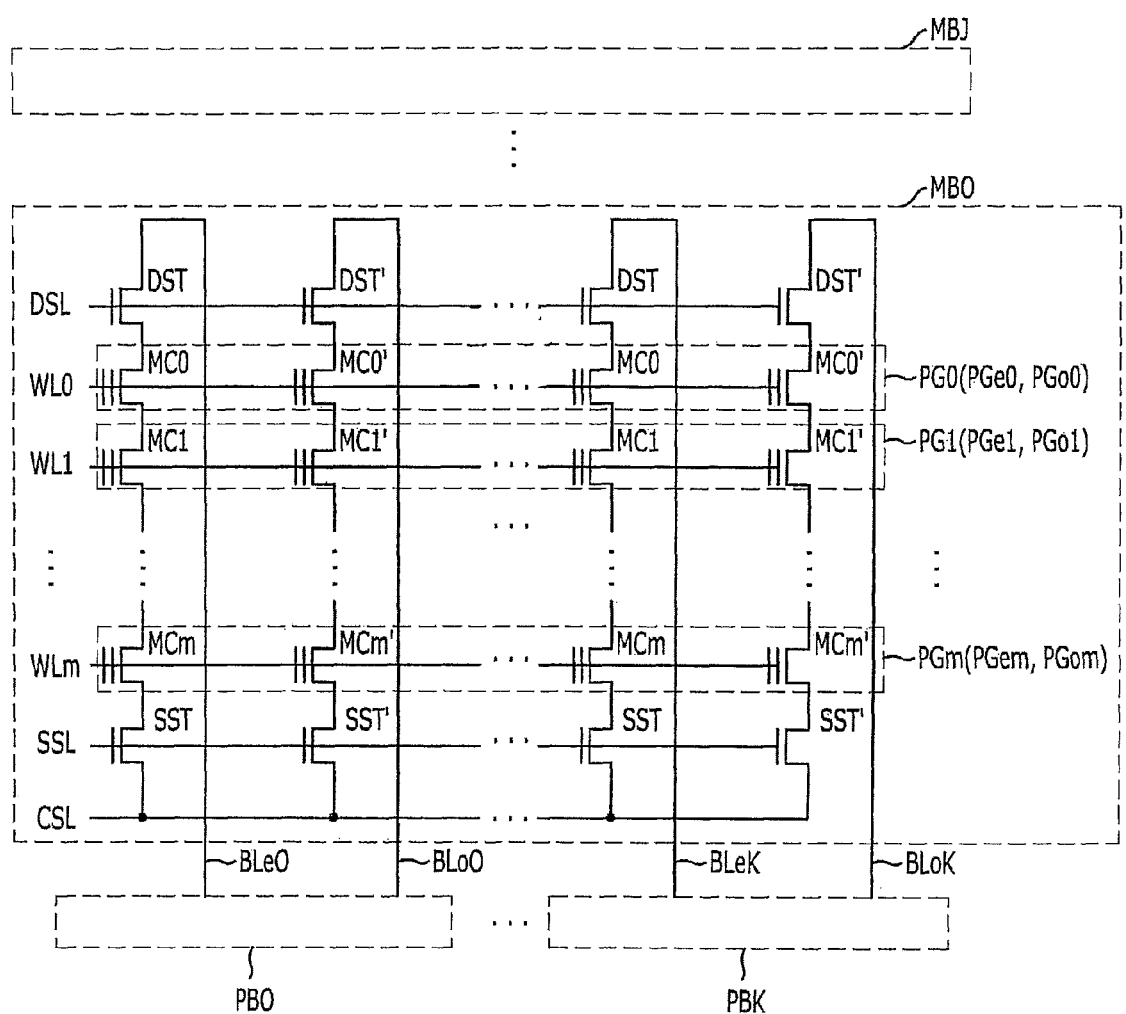
FIG. 1 is a diagram illustrating a basic structure of a non-volatile memory device according to prior art.
Figure 2:
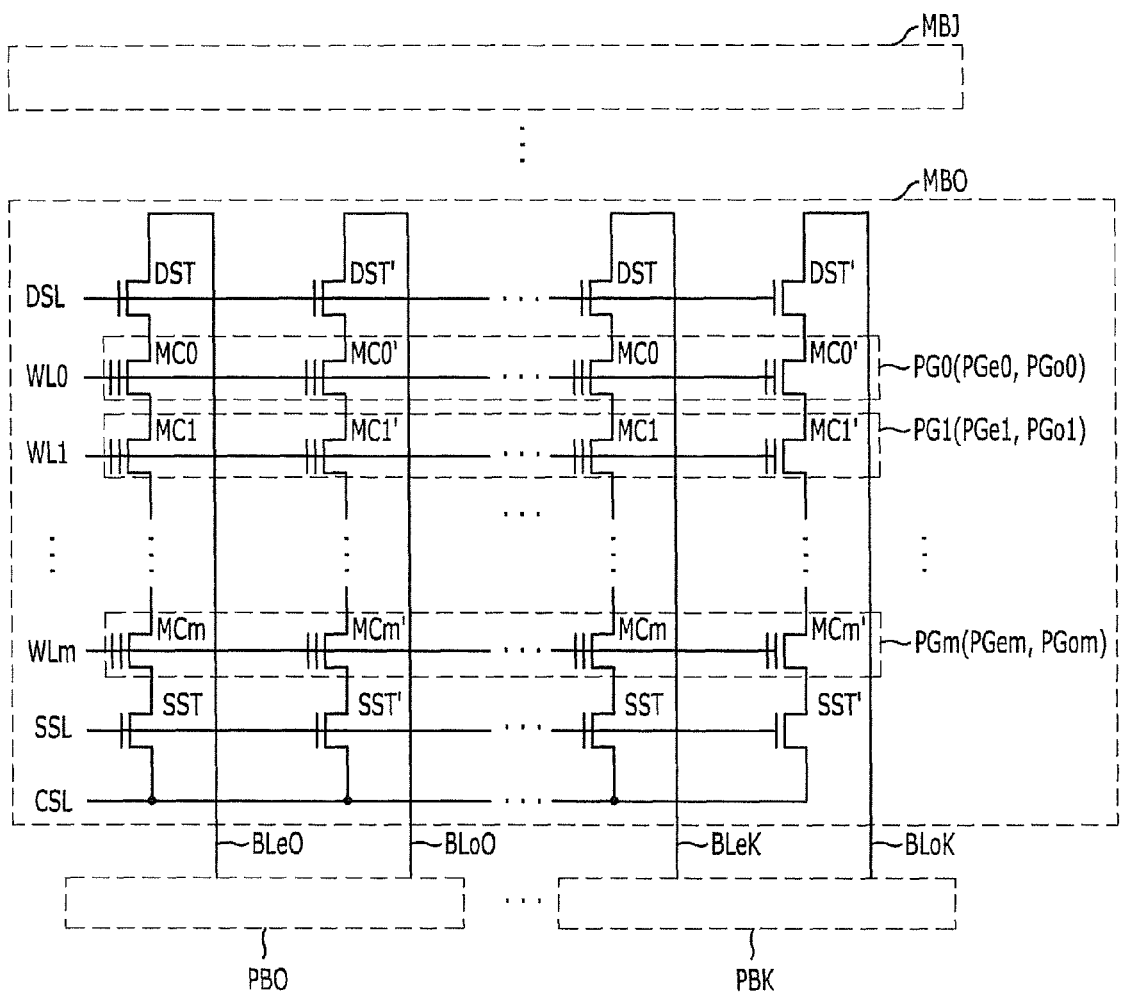
FIG. 2 is a diagram illustrating a basic structure of a non-volatile memory device in accordance with an embodiment of the present invention.

FIG. 2 is a diagram illustrating a basic structure of a non-volatile memory device in accordance with an embodiment of the present invention. In FIG. 2, DSL denotes a drain selection line and SSL denotes a source selection line.

As shown in FIG. 2, a cell array of a non-volatile memory device according to the present embodiment such as a NAND flash memory device includes a plurality of memory cells MC, a plurality of word lines WL for selecting and activating the memory cells MC and a plurality of bit lines BL for inputting and outputting data to and from the memory cells MC. The plurality of word lines WL and bit lines BL are arranged in matrix. Here, the plurality of memory cells MC are connected between a source selection transistor SST and a drain selection transistor DST in series. That is, the plurality of memory cells MC form a string structure.

A gate electrode of each memory cell MC is connected to a corresponding word line WL. A set of memory cells MC commonly connected to the same word line WL is referred as a page PG. The page PG may be divided into an even page connected to even bit lines BLe and an odd page connected to odd bit lines BLo. An even bit line BLe and an odd bit line BLo may be connected to one page buffer PB. A plurality of strings connected to each bit line BL are connected to a common source line CSL in parallel, thereby forming a memory block MB.

The NAND flash memory device having the above described structure performs a program operation and a read operation by a unit of a page PG and performs an erase operation by a unit of a memory block MB.

Figure 3:
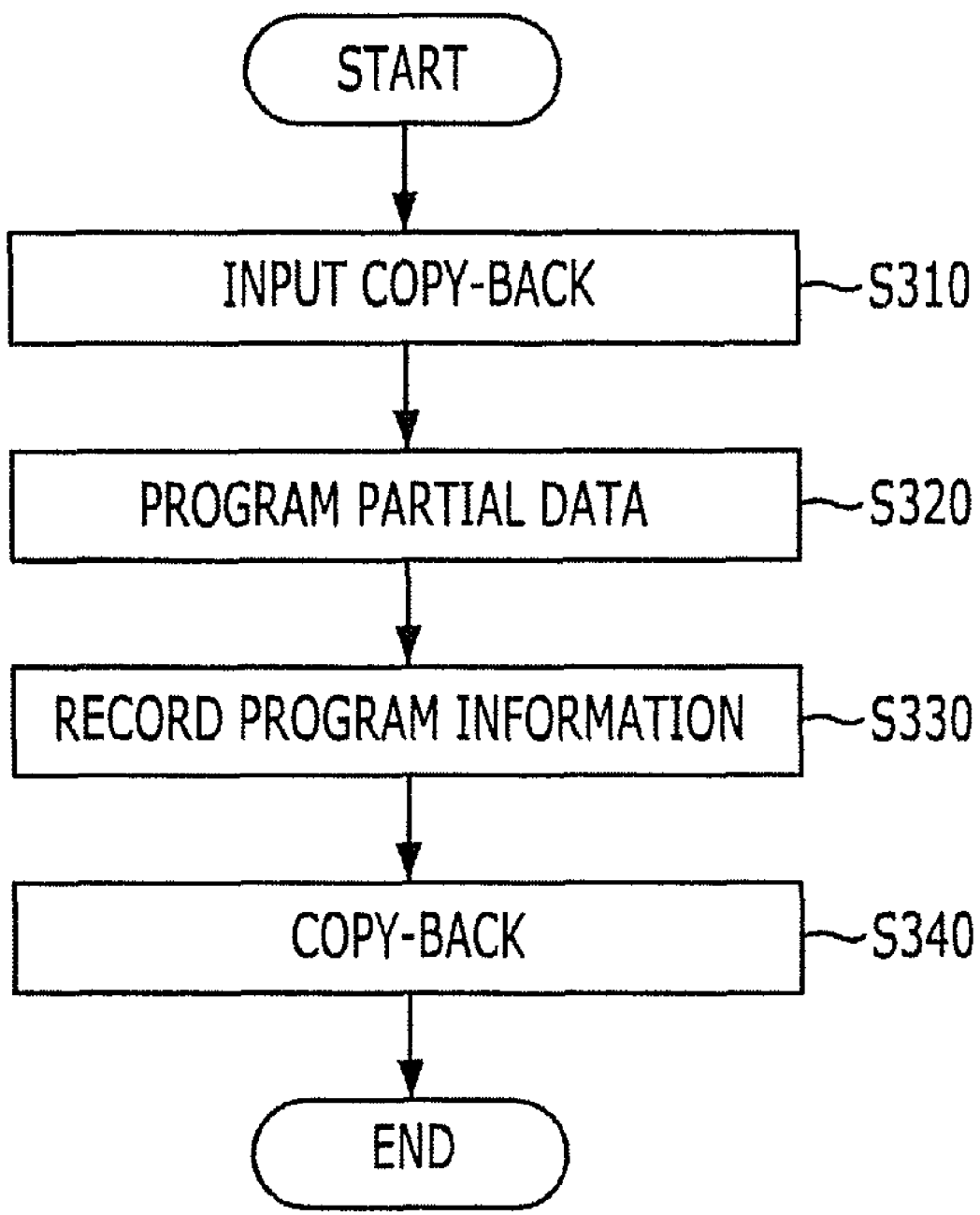
FIG. 3 is a flowchart describing a copy-back method for a non-volatile method device where the present invention is applied.

FIG. 3 is a flowchart describing a copy-back method for a non-volatile method device where the present invention is applied.

At step S310, a copy-back command is inputted to a driver. The copy-back command denotes an instruction for programming data stored in a source block into a target block. That is, the copy-back command transfers data stored in the source block into the target block. Here, the driver may be a page buffer PB in an embodiment.

The driver programs a part of target data of the copy-back operation into the target block at step S320. That is, the driver reads the part of the source block and programs the read data into the target block. Here, the part of the target data may be data stored in a memory cell of a source page included in a source block or a page among a plurality of pages included in a source block.

At first, performing a copy-back operation when the driver reads the part of the target data stored in a memory cell among a source page of a source block will be described. Here, the part of the target data may be data stored in one of a plurality of memory cells included in a source page. The part of the target data may also be data stored in a memory cell in an even page or data stored in a memory cell in an odd page.

For example, if a copy-back command for copying back data stored in a $0^{th}$ page PG0 of a $0^{th}$ memory block MB0 to a $0^{th}$ page PG0 of a first memory block MB1, the driver reads a part of data stored in a memory cell MC0 among the data stored in the $0^{th}$ page PG0 of the $0^{th}$ memory block MB0 and programs the read data into the $0^{th}$ page PG0 of the first memory block MB1.

Secondly, performing a copy-back operation when the driver reads the part of the target data stored in a page in a source block will be described. Here, the part of the target data may be stored in one of a plurality of pages in a source block. If the source block includes a plurality of even pages and odd pages, the part of the target data may be stored in one of the even pages or in one of the odd pages.

For example, when a driver receiving a command for copying back data stored in a $0^{th}$ memory block MB0 to a first memory block MB1, the driver reads data stored in the $0^{th}$ page PG0 in the $0^{th}$ memory block MB0 and programs the read data into the first memory block MB1.

At step S330, the driver measures and records program information for programming the part of the target data to copy-back. The program information may be a maximum program voltage, a program time, or repetition times of applying a program pulse while programming the part of the target data based on the ISPP method.

Since the ISPP method repeatedly applies a pulse type program voltage to perform a programming operation while increasing the pulse type program voltage by a predetermined level, the driver records a maximum program voltage, a program time, or a repetition time of applying a program pulse until the part of the target data is completely programmed.

A flag cell may be used to record the program information of the part of the target data. That is, the program information of the part of the target data may be recorded using a threshold voltage of a flag cell. For example, the flag cell may be a charge trap type non-volatile memory cell, a floating gate type non-volatile memory cell, a FeRAM, or a PRAM.

At step S340, a copy-back operation is performed using the recorded program information of the part of the target data. The copy-back operation includes a copy-back read operation and a copy-back program operation. The copy-back program operation may be preferably performed based on the ISPP method.

The driver decides a program condition of a copy-back operation using the program information used to program the part of the target data. For example, the driver may decide the maximum program voltage for programming the part of target data as an upper limit value of a program voltage that can be applied to perform a copy-back operation. Furthermore, the driver may decide the program time for programming the part of the target data may be decided as a maximum program time of a copy-back operation or the driver may decide the repetition time of applying a program pulse for programming the part of the target data as a maximum number of applying a program pulse of a copy-back operation.

For example, if a maximum program voltage for programming the part of the target data is recorded as 18V in a non-volatile memory device that can apply the maximum program voltage of 25V, the driver sets 18V as the maximum voltage of a copy-back operation. Therefore, a program voltage of 18V can be applied to a corresponding target page as the maximum program voltage. That is, if a program voltage reaches to 18V while programming a current page, a copy-back program starts programming the next page.

In the present embodiment, the program information for programming the part of target data is confirmed when a copy-back command is inputted. Then, a copy-back operation is performed using the confirmed program information. Therefore, it may be possible to properly decide the operation condition of the copy-back operation according to a state of a corresponding memory cell. Although a repaired column is included in a memory block, it is possible to prevent unnecessary high voltage from applying to a memory cell because the recorded maximum program voltage is recorded as the upper limit value.

The memory cells may be deteriorated due to repetition of program operation and erase operation. Thus, it is necessary to control a program voltage according to a deterioration degree of each memory cell. In the present invention, it may be possible to confirm program information that varies according to a state of a corresponding memory cell by programming partial data. Therefore, it may be possible to prevent large voltage from unnecessarily applying to a corresponding memory cell. That is, interference between adjacent memory cells can be minimized.

Figure 4:
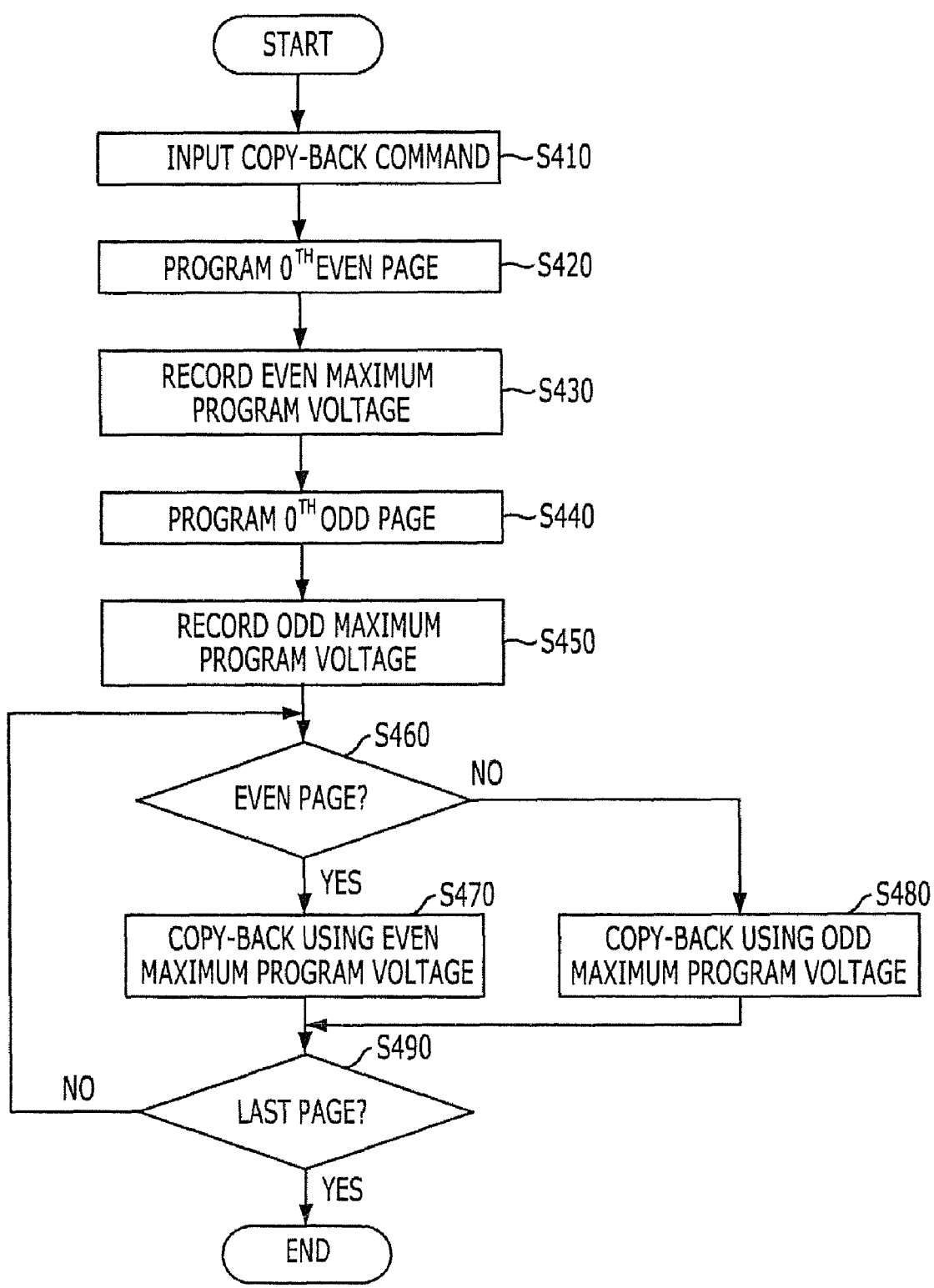
FIG. 4 is a flowchart describing a method for performing a copy-back operation in a non-volatile memory device in accordance with an embodiment of the present invention.

FIG. 4 is a flowchart describing a method for performing a copy-back operation in a non-volatile memory device in accordance with an embodiment of the present invention. In the present embodiment, a copy-back operation is performed using program information such as a maximum program voltage. Particularly, maximum program voltages of an even page and an odd page are measured and recorded as program information. Then, the recorded program information such as the maximum program voltages is used to perform the copy-back operation.

At first, a driver receives a copy-back command for programming data stored in a source block into a target block at step S410. The driver may be a page buffer PB.

At step S420, the driver programs a part of target data. If each page PG is formed of even pages PGe and odd pages PGo, as shown in FIG. 2, data stored in one of the even pages PGe and one of the odd pages PGo of the source block is programmed.

For example, the driver reads data stored in a $0^{th}$ even page PGe0 as a part of target data and programs the read data into a target block.

At step S430, the driver measures and records a maximum program voltage used to program the data stored in the $0^{th}$ even page PGe0, that is, an even maximum program voltage. Here, an incremental step pulse program (ISPP) method may be used to program the part of target data. The ISPP method repeatedly applies a program voltage while increasing a pulse type program voltage by a predetermined level to perform a program operation. Therefore, a maximum program voltage means a maximum upper limit value of a program voltage applied until a corresponding page is completely programmed.

At step S440, the driver reads data stored in a $0^{th}$ odd page PGo0 as a part of target data and programs the read data in a target block. At step S450, the driver measures and records a maximum program voltage used to program the $0^{th}$ odd page PGo0, that is, an odd maximum program voltage.

Here, the order of measuring and recording the even maximum program voltage and the odd maximum program voltage may be changed. In this case, an even maximum program voltage of an even page is recorded after an odd maximum program voltage of an odd page is recorded. Also, a program time or a repetition time of applying a program pulse may be recorded.

Then, a driver performs a copy-back program using the recorded maximum program voltage. At first, the driver determines whether a page to copy-back is an even page or an odd page at step S460. If the driver determines that the page to copy-back is an even page, the driver performs the copy-back operation using the recorded even maximum program voltage as an upper limit value of a program voltage that can be applied to at step S470. On the contrary, if the driver determines that the page to copy-back is an odd page, the driver performs the copy-back operation using the recorded odd maximum program voltage as an upper limit value of a program voltage that can be applied to at step S480.

At step S490, the driver determines whether a page, that the copy-back operation is performed on, is the last page or not. If it is not the last page, the step S460 is performed again. If it is the last page, the copy-back operation is terminated.

As described above, it is possible to properly decide an upper limit value of a program voltage, that is, a maximum program voltage, according to a state of a corresponding memory cell when a copy-back command is inputted. Particularly, in the present embodiment, the even maximum program voltage and the odd maximum program voltage are recorded and the copy-back operation is performed based on the recorded even and odd maximum program voltages in order to precisely reflect the states of a plurality of pages included in a source block.

In general, same type pages may have a similar state although pages in the same memory block may be slightly different in state. For example, in case of a $0^{th}$ source block, a state of a $0^{th}$ even page PGe0 is similar to a state of a first even page PGe1, and a state of a $0^{th}$ odd page PGo0 is similar to a state of a first odd page PGo1. Therefore, after measuring and recording the maximum program voltages of the even page and the odd page, the even maximum program voltage is applied to an even page for the copy-back operation or the odd maximum program voltage is applied to an odd page for the copy-back operation.

Figure 5:
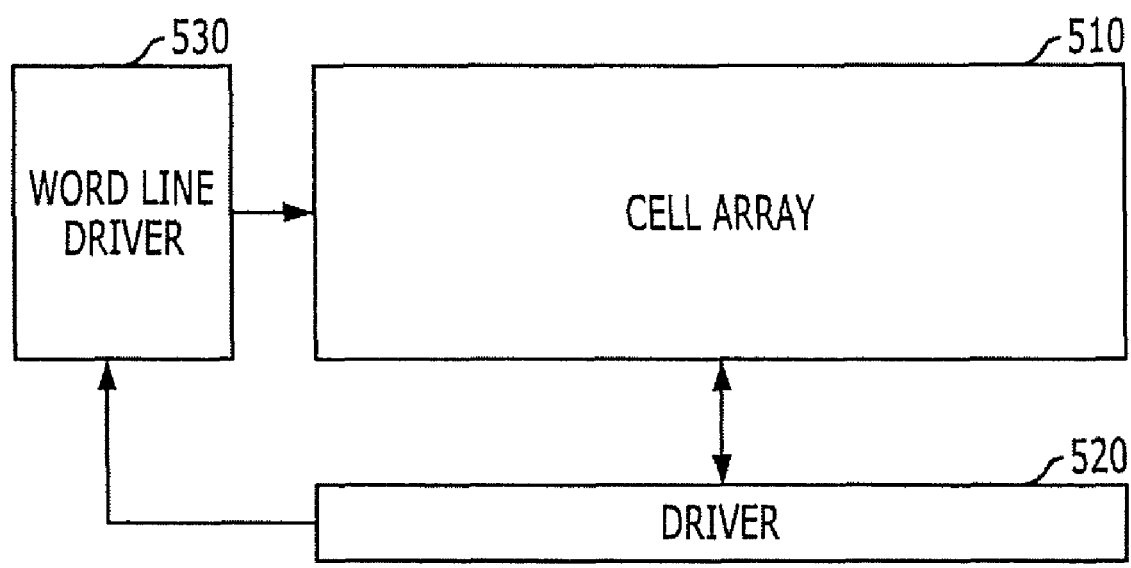
FIG. 5 shows a structure of a non-volatile memory device in accordance with an embodiment of the present invention.

FIG. 5 is a diagram illustrating a non-volatile memory device in accordance with an embodiment of the present invention. As shown, a non-volatile memory device includes a cell array 510, a driver 520, and a word line driver 530.

The cell array 510 includes a plurality of memory blocks and each of the memory blocks includes a plurality of pages.

A page includes a plurality of memory cells that commonly share the same word line and may be divided into an odd page and an even page.

The driver 520 records program information used to program a part of target data to copy-back when a copy-back command for data stored in the cell array 510 is inputted. Then, the driver 520 performs the copy-back operation using the recorded program information. Here, the driver 520 may be a page buffer in an embodiment.

Here, the program information may be an upper limit value of a program voltage, a program time, and a repetition time of applying a program pulse, which can be used to program the part of the target data using the ISPP method. The program information may be recorded using a flag cell. The flag cell may be a charge trap-type non-volatile memory cell, a floating gate non-volatile memory cell, a FeRAM, or a PRAM.

For example, when a copy-back command for programming the data stored in a source block is inputted, the driver 520 measures and records a used maximum program voltage while reading and programming data stored in one of a plurality of pages included in a source block. The maximum program voltage denotes a maximum value of a program voltage used to program data based on the ISPP method.

The driver 520 also transmits the recorded program information to the word line driver 530 to control a copy-back program condition based on the recorded program information during a copy-back operation.

The word line driver 530 performs a program operation by applying a program voltage to a word line during a program operation. Here, a condition of applying a program voltage for a copy-back operation is set by the program information received from the driver 520. For example, the word line driver 530 applies a copy-back program voltage to a word line by setting a maximum program voltage used to program a part of target gate as an upper limit value of a program voltage that can be applied during a copy-back operation, setting a program time used to program a part of target data as a maximum program time of a copy-back operation, or setting a repetition time of applying a program pulse used to program a part of target data as a maximum time of applying a program pulse for a copy-back operation while performing the copy-back operation based on the ISPP method.

Therefore, the word line driver 530 may apply a copy-back program voltage by setting a proper program condition by each page during a copy-back operation. Therefore, memory device property can be improved by preventing large voltage from unnecessarily applying during a copy-back operation.

Since the copy-back operation of the non-volatile memory device of FIG. 5 is identical to that shown in FIGS. 3 and 4, detail description thereof is omitted for the sake of convenience.

Embodiments of the present invention relate to a non-volatile memory device and a method for performing a copy-back operation thereof. According to the embodiments of the present invention, interference between adjacent memory cells can be minimized by controlling an upper limit value of a program voltage used for a copy-back operation according to memory cell property when a copy-back command is inputted. That is, a maximum program voltage is controlled according to the memory cell property.

Particularly, a maximum program voltage used to program a part of target data to copy-back is determined, and a copy-back operation is performed using the determined maximum program voltage in the embodiments of the present invention. Accordingly, the maximum program voltage value can be properly controlled according to a state of a corresponding memory cell during the copy-back operation. Therefore, interference between adjacent memory cells can be prevented, and memory device property can be improved.

While the present invention has been described with respect to the specific embodiments, it will be apparent to those skilled in the art that various changes and modifications may be made without departing from the spirit and scope of the invention as defined in the following claims.

What is claimed is:

1. A method for performing a copy-back operation in a non-volatile memory device, comprising:
   measuring and recording a maximum program voltage used for a copy-back program by performing a copy-back operation of a part of target data when a copy-back command is inputted; and
   performing the copy-back operation of the remaining target data using the recorded maximum program voltage.

2. The method of claim 1, wherein the performing of the copy-back operation includes programming a data stored in a source block into a target block.

3. The method of claim 2, wherein each of the source block and the target block includes even pages and odd pages,
   wherein the measuring and recording of a maximum program voltage includes measuring and recording maximum program voltages used to perform the copy-back program on the data stored in one of even pages and one of odd pages of the source block, and
   wherein the performing of the copy-back operation includes performing the copy-back operation for the remaining even pages of the source block using the recorded maximum program voltage used to perform the copy-back program on the data stored in one of the even pages, and performing the copy-back operation for the remaining odd pages of the source block using the recorded maximum program voltage used to perform the copy-back program on the data stored in one of the odd pages.

4. The method of claim 1, wherein the maximum program voltage includes an upper limit value of a program voltage used to perform the copy-back program on the part of target data using an Incremental Step Pulse Program (ISPP) method.

5. The method of claim 1, wherein the measuring and recording of a maximum program voltage includes recording the maximum program voltage using a flag cell.

6. A method for performing a copy-back operation in a non-volatile memory device, comprising:
   measuring and recording program information used for a copy-back program by performing a copy-back operation of a part of target data when a copy-back command is inputted; and
   performing the copy-back operation of the remaining target data using the recorded program information.

7. The method of claim 6, wherein the program information includes a maximum value of a program voltage, a program time, and a repetition time of applying a program pulse, which are used to perform the copy-back program on the part of target data using an Incremental Step Pulse Program (ISPP) method.

8. The method of claim 6, wherein the performing of the copy-back operation includes programming a data stored in a source block into a target block.

9. A non-volatile memory device, comprising:
   a cell array; and
   a driver for measuring and recording a maximum program voltage used for a copy-back program by performing a copy-back operation of a part of target data when a copy-back command for data stored in the cell-array is received, and performing the copy-back operation of the remaining target data using the recorded maximum program voltage.

10. The non-volatile memory of claim 9, wherein the cell array includes a source block and a target block.

11. The non-volatile memory device of claim 10, wherein each of the source block and the target block includes even pages and odd pages, and wherein the driver measures and records maximum program voltages used to perform the copy-back program on the data stored in one of the even pages and one of the odd pages of the source block, the remaining even pages of the source block are copied-back using the maximum program voltage of the even page, and the remaining odd pages of the source block are copied-back using the maximum program voltage of the odd page.

12. The non-volatile memory device of claim 9, wherein the cell array includes a source page and a target page.

13. The non-volatile memory device of claim 9, wherein the maximum program voltage is an upper limit value of a program voltage used when the part of target data is copy-back programmed using an Incremental Step Pulse Program (ISPP) method.

14. The non-volatile memory device of claim 9, wherein the driver records the maximum program voltage using a flag cell included in the cell array.

* * * * *